(12) United States Patent
Brantley et al.

(10) Patent No.: US 10,461,706 B1
(45) Date of Patent: Oct. 29, 2019

(54) DIFFERENTIAL AMPLIFIER INCLUDING CANCELLATION CAPACITORS

(71) Applicant: TEXAS INSTRUMENTS INCORPORATED, Dallas, TX (US)

(72) Inventors: Steven G. Brantley, Satellite Beach, FL (US); Bharath Karthik Vasan, Tucson, AZ (US); Srinivas K. Pulijala, Tucson, AZ (US); Martijn Snoeij, Erding (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/966,946

(22) Filed: Apr. 30, 2018

(51) Int. Cl.
*H03F 3/45* (2006.01)
*H03F 3/68* (2006.01)
*H03F 1/02* (2006.01)
*H03F 1/08* (2006.01)

(52) U.S. Cl.
CPC ....... *H03F 3/45089* (2013.01); *H03F 1/0216* (2013.01); *H03F 1/083* (2013.01); *H03F 3/45188* (2013.01); *H03F 3/68* (2013.01); *H03F 2200/267* (2013.01); *H03F 2200/285* (2013.01); *H03F 2200/462* (2013.01); *H03F 2203/45031* (2013.01)

(58) Field of Classification Search
CPC .................................................. H03F 3/45089
See application file for complete search history.

(56) References Cited

U.S. PATENT DOCUMENTS

| | | | | |
|---|---|---|---|---|
| 4,713,625 A | * | 12/1987 | Whatley | H03F 1/086 330/149 |
| 4,994,688 A | * | 2/1991 | Horiguchi | G05F 1/465 323/314 |
| 5,377,273 A | | 12/1994 | Sutton | |
| 5,420,524 A | * | 5/1995 | Webster | H03F 1/083 326/127 |
| 5,491,443 A | * | 2/1996 | Zarabadi | H03F 3/505 327/328 |
| 5,497,125 A | | 3/1996 | Royds | |
| 6,069,502 A | * | 5/2000 | Preslar | G11C 27/026 327/91 |

(Continued)

FOREIGN PATENT DOCUMENTS

CN 103618547 3/2014

OTHER PUBLICATIONS

International Search Report in corresponding PCT Application No. PCT/US2019/029921, dated Aug. 8, 2019 (2 pages).

*Primary Examiner* — Patricia T Nguyen
(74) *Attorney, Agent, or Firm* — John R. Pessetto; Charles A. Brill; Frank D. Cimino

(57) ABSTRACT

In examples, a system comprises a differential amplifier coupled to a parasitic capacitor positioned between a first node and a first reference voltage source. The system comprises a buffer amplifier having an input terminal and an output terminal, the input terminal coupled to the first node and the output terminal coupled to a cancellation capacitor. The system includes a controlled current source coupled to the first node and the input terminal, the controlled current source coupled to a second reference voltage source. The system comprises a current sense circuit coupled to the cancellation capacitor and the second reference voltage source.

16 Claims, 4 Drawing Sheets

(56) References Cited

U.S. PATENT DOCUMENTS

| | | | |
|---|---|---|---|
| 9,923,500 B1 | 3/2018 | Ummelmann et al. | |
| 2007/0252648 A1* | 11/2007 | Ravezzi | H03F 3/45183 330/257 |
| 2010/0033250 A1* | 2/2010 | Shimatani | H03F 3/45183 330/253 |
| 2010/0214033 A1* | 8/2010 | Fleming | H03K 3/011 331/57 |

* cited by examiner

DIFFERENTIAL AMPLIFIER INCLUDING CANCELLATION CAPACITORS

BACKGROUND

An operational amplifier (op-amp) is a direct-coupled high-gain amplifier that is used to amplify direct current (DC) input signals as well as alternating current (AC) signals. With the addition of relevant external components, an op-amp can be employed for a variety of other applications, such as active filters, oscillators, comparators, and regulators.

SUMMARY

In examples, a system comprises a differential amplifier coupled to a parasitic capacitor positioned between a first node and a first reference voltage source. The system comprises a buffer amplifier having an input terminal and an output terminal, the input terminal coupled to the first node and the output terminal coupled to a cancellation capacitor. The system includes a controlled current source coupled to the first node and the input terminal, the controlled current source coupled to a second reference voltage source. The system comprises a current sense circuit coupled to the cancellation capacitor and the second reference voltage source.

In examples, a system includes a differential amplifier. The differential amplifier comprises a first bipolar junction transistor (BJT) having a first emitter terminal, a first collector terminal, and a first base terminal; a second BJT having a second emitter terminal, a second collector terminal, and a second base terminal, wherein the first and the second emitter terminals couple at a common emitter node; a parasitic capacitor coupled between the common emitter node and a first voltage source; a third BJT having a third emitter terminal, a third collector terminal, and a third base terminal, the third emitter terminal coupled to the first collector terminal; a fourth BJT having a fourth emitter terminal, a fourth collector terminal, and a fourth base terminal, the fourth emitter terminal coupled to the second collector terminal, and the third base terminal coupled to the fourth base terminal; and a tail current source coupled to the common emitter node and to the first voltage source. The system also comprises a level shifter circuit coupled to the differential amplifier. The system includes a cancellation capacitor coupled between the level shifter and the tail current source.

In examples, an operational amplifier input stage comprises a differential amplifier comprising a pair of driver metal oxide semiconductor field effect transistors (MOSFETs); a first current source including a first pair of bipolar junction transistors (BJTs); and a parasitic capacitor coupled to a voltage source and to a common emitter node, the common emitter node coupled to emitters of the BJTs in the second pair of BJTs. The differential amplifier also comprises a translinear loop coupled to the first current source and including a second pair of BJTs, a first diode coupled to the second pair of BJTs, a first resistor coupled to the first diode, a second diode coupled to the first resistor, a third pair of BJTs coupled to the second diode, a third diode coupled to the third pair of BJTs, a second resistor coupled to the third diode, and a fourth diode coupled to the second resistor. The input stage also includes a transconductance linearization circuit comprising a second current source comprising a fourth pair of BJTs, the fourth pair of BJTs in a cascoded configuration; at least one translinear loop coupled to the second current source and comprising a plurality of BJTs; and a BJT positioned between the at least one translinear loop and the first current source, a base of the BJT coupled to bases of the BJTs in the first pair of BJTs. The input stage includes a cancellation capacitor coupled to the second current source and to the common emitter node.

BRIEF DESCRIPTION OF THE DRAWINGS

For a detailed description of various examples, reference will now be made to the accompanying drawings in which.

DETAILED DESCRIPTION

Operational amplifiers (op-amps) contain multiple stages: an input stage, an intermediate stage, a level-shifting stage, and an output stage. Each of these stages performs a different function. Generally, the input stage provides most of the gain that is imparted to an input signal by an op-amp. The input stage comprises a differential transistor pair. Such differential transistor pairs typically have non-linear transfer functions. Such non-linear behavior has various causes—for example, the output impedance of tail current in the input stage and parasitic capacitor(s) formed between the input stage and the connections to the other stages of the op-amp.

The non-linearities mentioned above are quantifiable by determining the harmonic distortion associated with the op-amp. Harmonic distortions have even and odd components. While existing solutions focus on modifying op-amps to remove odd harmonic distortions, they do not adequately mitigate even harmonic distortions caused by parasitic capacitors in the op-amp.

Accordingly, this disclosure describes systems and methods that are directed towards eliminating the even harmonic components that are generated due to the presence of a parasitic capacitor in an input stage of an op-amp. In some examples, the even harmonic components can be substantially eliminated by employing a buffer amplifier and a cancellation capacitor in the input stage. In some examples, the buffer amplifier and the cancellation capacitor are coupled in an input stage such that the cancellation capacitor generates a cancellation current that substantially cancels an error current that is formed due to the parasitic capacitor and that gives rise to the even harmonic distortion. Thus, substantially cancelling this error current substantially removes the even harmonic components from the input stage. In at least some examples, the capacitances of the cancellation capacitor and the parasitic capacitor are substantially equal (where "substantially" means that one of the capacitances is within 10% of the other). In at least some examples, the capacitances of the cancellation capacitor and the parasitic capacitor are proportional.

Figure 1:
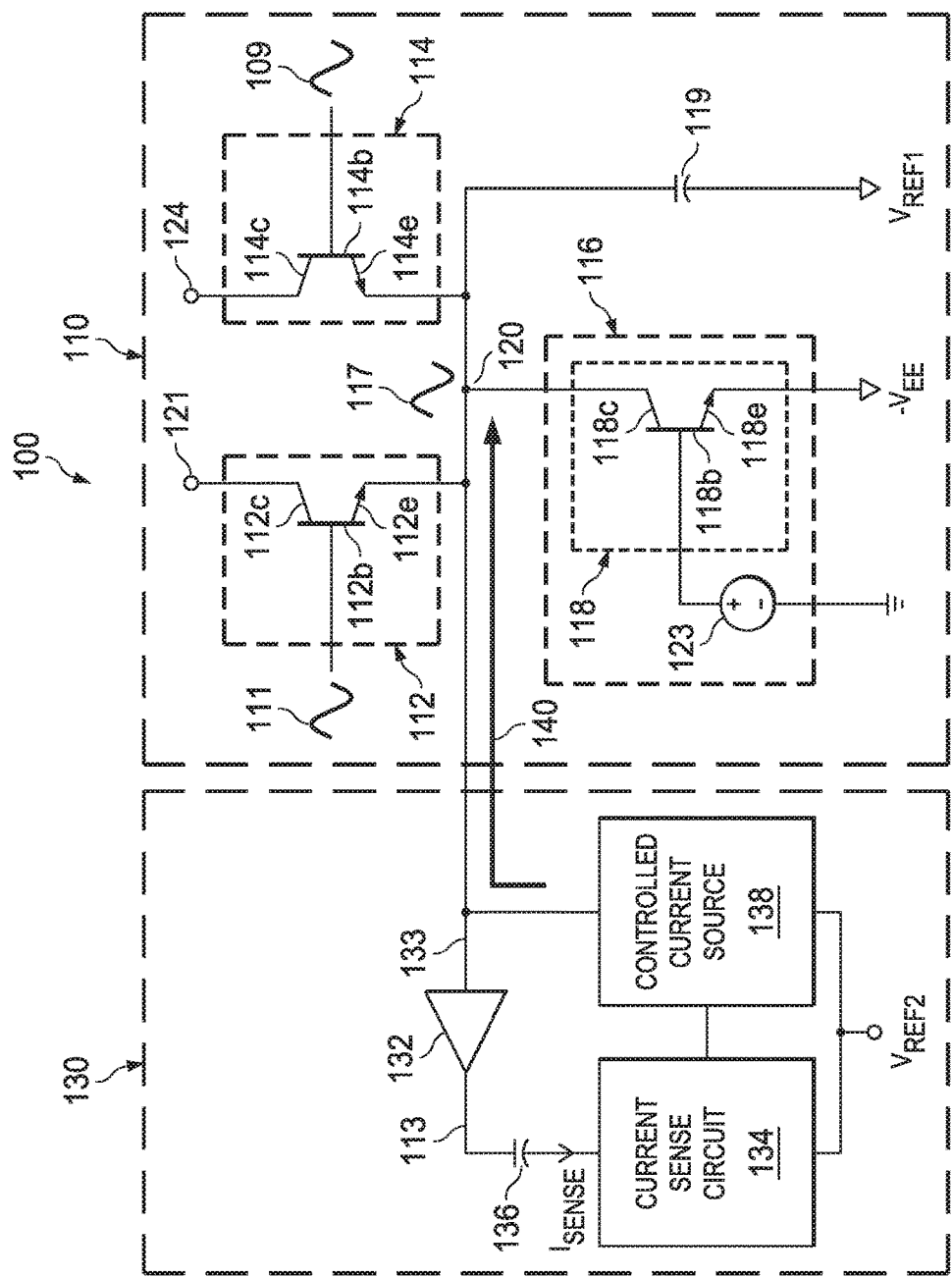
FIG. 1 depicts a schematic diagram of an illustrative input stage of an op-amp, in accordance with various examples.

Referring now to FIG. 1, a schematic diagram of an illustrative input stage 100 is shown. The input stage 100 includes a differential amplifier 110 that is coupled to an even harmonic distortion cancellation circuit 130. In some examples, the differential amplifier 110 includes two bipolar junction transistors (BJT) 112, 114. The BJT 112 includes a collector terminal 112c, a base terminal 112b, and an emitter terminal 112e. The BJT 114 includes a collector terminal 114c, a base terminal 114b, and an emitter terminal 114e. In some examples, the emitter terminals 112e and 114e are coupled to each other at a common emitter node 120. In some examples, the collector terminals 112c and 114c form the outputs 121, 124, respectively, of the input stage 100. The outputs 121, 124, in some examples, couple to succeeding stages of the op-amp.

The differential amplifier 110, as depicted in FIG. 1, also includes a tail current source 116 that includes a BJT 118. The BJT 118 includes an emitter terminal 118e, a base terminal 118b, and a collector terminal 118c. The base terminal 118b, in some examples, is coupled to a DC voltage source 123. In some examples, the tail current source 116 includes a current mirror (not expressly shown), and the BJT 118 may form a portion of such a current mirror. In some examples, the emitter terminal 118e couples to a negative voltage supply (−Vee). The input stage 100 also includes a parasitic capacitor 119 that is formed between the common emitter node 120 and a reference voltage source Vref1.

In the preceding description of the differential amplifier 110, the BJTs 112, 114, 118 are NPN BJTs. However, examples of the differential amplifier 110 described above may employ some other type of BJT (e.g., PNP BJT or a combination of both NPN BJT and PNP BJT) or a metal oxide semiconductor field effect transistor (MOSFET) in the differential amplifier 110. The differential amplifier 110 depicted in FIG. 1 is merely one type of differential amplifier. In other examples, the differential amplifier 110 may assume a different structure, and the input stage 100 can be adapted to include the different structure of the differential amplifier 110.

Still referring to FIG. 1, the harmonic distortion cancellation circuit 130 includes a voltage buffer amplifier 132 (also referred to as "buffer amplifier") that has an input terminal 133 and an output terminal 113. The input terminal 133 couples to the common emitter node 120. In some examples, the buffer amplifier 132 is a unity gain amplifier. The harmonic distortion cancellation circuit 130 further includes a cancellation capacitor 136 that is coupled to the output terminal 113. The harmonic distortion cancellation circuit 130 also includes a current sense circuit 134 that couples to the cancellation capacitor 136 and receives a current from the cancellation capacitor 136. The harmonic distortion cancellation circuit 130 also includes a controlled current source circuit 138 that couples to the common emitter node 120, the input terminal 133, and a reference voltage source Vref2. In some examples, the current sense circuit 134 drives the controlled current source 138 to generate a cancellation current.

The controlled current source 138 generates a current based on the signal received by the current sense circuit 134 (e.g., Isense current). The controlled current source 138, in some examples, is configured to receive a signal from the current sense circuit 134 and control the current flowing through the controlled current source 138. In some examples, the current flowing through the controlled current source 138 is also referred to as a cancellation current that substantially eliminates the even harmonic components. The current sense circuit 134, along with the controlled current source 138 couples to the reference voltage source Vref2. The function of the current sense circuit 134 and the controlled current source 138 is implemented by a circuit arrangement suitable to perform such a function. In some examples, as further described in FIG. 2, the functions of both the current sense circuit 134 and the controlled current source 138 is performed by the same circuit element, such as a transistor.

In some examples, the reference voltage sources Vref1 and Vref2 are positive or negative voltage sources. In some examples, the positive or negative voltage sources act as voltage supplies for the integrated circuit (IC) in which the input stage 100 is disposed. In some examples, the reference voltage sources Vref1, Vref2 can be DC voltage sources. In other examples, the reference voltage sources Vref1, Vref2 are ground connections, or is coupled to a ground voltage source. In some examples, the capacitance of the parasitic capacitor 119 can be calculated using extraction tools and, based on that parasitic capacitance value, an appropriate cancellation capacitor 136 may be employed. For example, simulation software is used to determine the parasitic capacitance, and a cancellation capacitor 136 is selected with a capacitance that is substantially equal to the parasitic capacitance or that is proportional to the parasitic capacitance.

In operation, differential input signals 109, 111 are fed to the base terminals 114b, 112b, respectively. The input signals 109, 111 drive (e.g., provide base signals to) the BJTs 114, 112, respectively, such that a common mode voltage swing appears on the node 120. This common mode voltage produces—by charging and discharging the parasitic capacitor 119—an error current 117, which flows (during charging) from the common mode node 120 to the parasitic capacitor 119. The error current 117 flows (during discharging) from the parasitic capacitor 119 to the common mode node 120. Stated another way, because of the presence of the parasitic capacitor 119, the error current 117, depending on the direction in which the error current 117 is moving, adds to or subtracts from the tail current flowing in the current source 116. This error current 117 can be attributed to the presence of the even harmonic components. Therefore, the elimination of this error current 117 may substantially eliminate the even harmonic components.

In examples, the buffer amplifier 132 is a unity gain amplifier (the output voltage is similar to the input voltage), the capacitance of the cancellation capacitor 136 is substantially similar to the capacitance of the parasitic capacitor 119, and the reference voltages Vref1 and Vref2 are substantially equal.

Still referring to the operation of FIG. 1, in some examples, the elimination of the error current 117 is performed by the even harmonic distortion cancellation circuit 130. The buffer amplifier 132 responds to the common mode voltage at the common emitter node 120 and outputs a voltage signal at the low-impedance output terminal 113. In some examples, the common mode voltage is alternating or has a finite frequency. Such a common mode voltage is sensed by the buffer amplifier 132 and results in a similar alternating voltage at the low impedance output terminal 113. Such a common mode voltage generates a sense current (Isense) through the cancellation capacitor 136. The magnitude of the current Isense depends on the amplitude of the voltage at the output node 113 and the capacitance value of the cancellation capacitor 136. The current Isense is sensed by the current sense circuit 134. The current sense circuit 134, in such a scenario, drives the controlled current source 138 to generate a cancellation current 140 that is substantially equal to the magnitude (and with an opposite polarity) of the error current 117. The cancellation current 140 substantially cancels the error current 117 at the common emitter node 120. In some examples, the cancellation current 140 is equal to β*Isense, where β depends on the circuitry employed in the controlled current source.

In some examples, the capacitance of the cancellation capacitor 136 may not be equal to the capacitance of the parasitic capacitor 119. In such examples, the controlled current source 138 can be scaled to generate the current required for cancellation. For example, the capacitance of the parasitic capacitor 119 is 50 fF and the capacitance of the cancellation capacitor is 30 fF. In such a case, the even harmonic distortion cancellation circuit 130 compensates this difference in the capacitance values by adapting the controlled current source 138. For examples, assume that the controlled current source 138 includes a portion of a current mirror. The capacitance values, in such an example, is compensated by increasing the number of transistors employed in the current mirror, and that generates more cancellation current to compensate for the difference in capacitance values of the cancellation capacitor and the parasitic capacitor.

Figure 2:
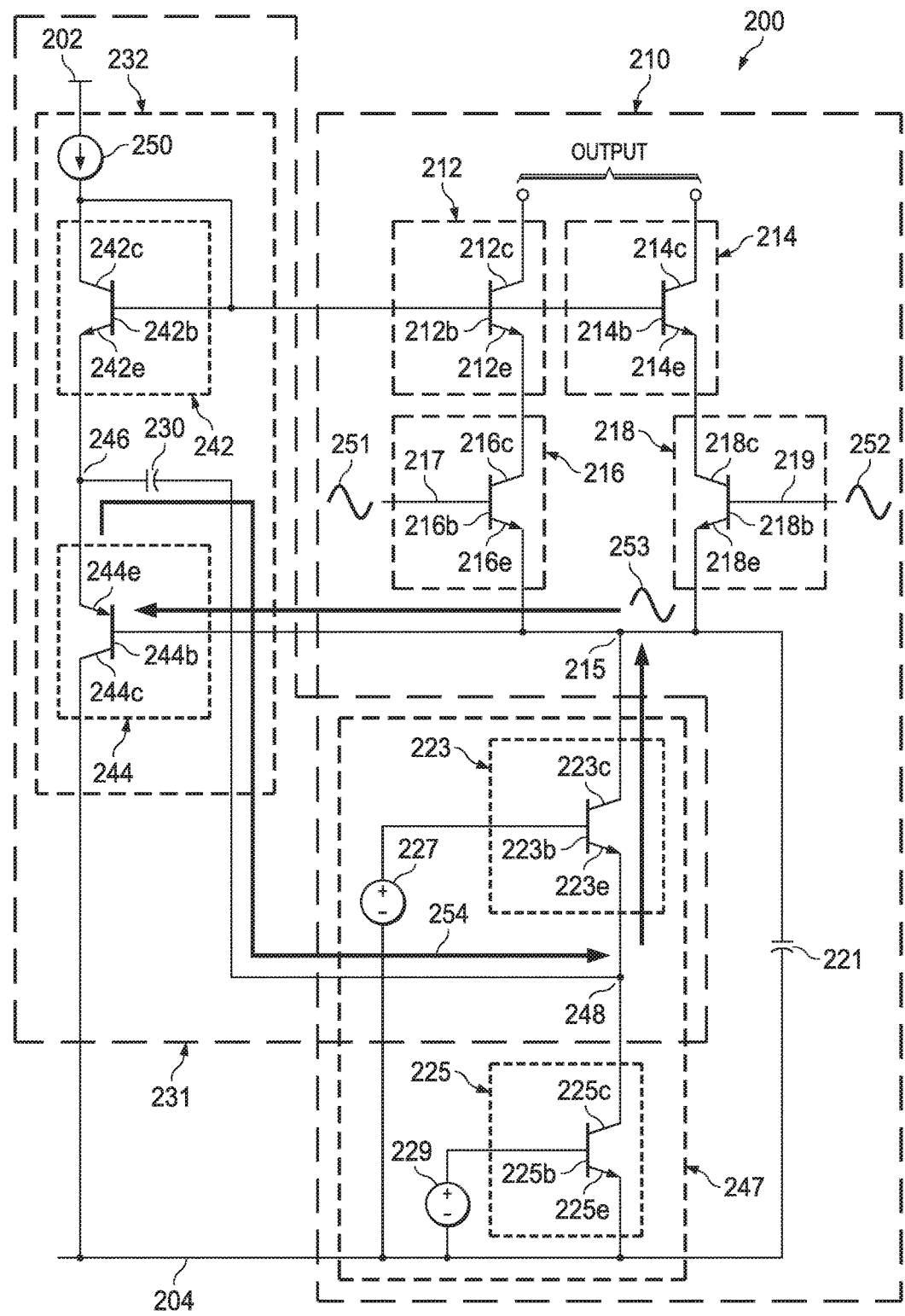
FIG. 2 depicts a schematic diagram of another illustrative input stage of an op-amp, in accordance with various examples.

Referring now to FIG. 2, a schematic diagram of another illustrative input stage 200 is shown. The input stage 200 includes a differential amplifier 210 that is coupled to an even harmonic distortion cancellation circuit 231. The differential amplifier 210 includes a main transistor pair formed by a BJT 216 and a BJT 218. The example depicted in FIG. 2 includes a cascoded differential amplifier. The cascoded transistor pair includes a BJT 212 and a BJT 214. The BJT 212 includes an emitter terminal 212e, a base terminal 212b, and a collector terminal 212c. The BJT 214 includes an emitter terminal 214e, a base terminal 214b, and a collector terminal 214c. The BJT 212 cascodes with the BJT 216 and the BJT 214 cascodes with the BJT 218. The harmonic distortion cancellation circuit 231 includes the cancellation capacitor 230, the BJT 244, the BJT 242, current source 250, and the BJT 223.

The BJT 216 includes an emitter terminal 216e, a collector terminal 216c, and a base terminal 216b, where the base terminal 216b is configured to receive a first input signal via an input terminal 217. The BJT 218 has an emitter terminal 218e, a collector terminal 218c, and a base terminal 218b, where the base terminal 218b is configured to receive a second input signal via an input terminal 219. The BJTs 216 and 218 are coupled to each other at a common emitter node 215.

The emitter terminal 212e is coupled to (or cascodes with) the collector terminal 216c, and the collector terminal 212c acts as one of the output terminals of the input stage 200 and is configured to be coupled to external relevant circuitry (e.g., the next stage of an op-amp). The emitter terminal 214e is coupled to (or cascodes with) the collector terminal 218c, where the collector is another output of the input stage 200, and is also configured to be coupled to external relevant circuitry (e.g., next stage of op-amp).

The differential amplifier 210 also includes a tail current source 247 that includes at least a BJT 225. In some examples, this tail current source 247 is a cascoded tail current source. In such examples, a BJT, such as BJT 223, is cascoded with the BJT 225.

The BJT 225 has an emitter terminal 225e, a collector terminal 225c, and a base terminal 225b, where the emitter terminal 225e and the base terminal 225b are coupled to a voltage source 204. In some examples, the voltage source 204 can be a negative voltage source. In other examples, the voltage source 204 can be a positive voltage source. In other examples, the voltage source 204 can be a ground voltage source. In some examples, the base terminal 225b couples to the voltage source 204 via an additional voltage source, such as a voltage source 229. In some examples, the voltage source 229 is implemented by a current mirror (not expressly shown), and the BJT 225 may form a portion of such a current mirror.

The BJT 223 includes an emitter terminal 223e, a collector terminal 223c, and a base terminal 223b, where the emitter terminal 223e is coupled to the collector terminal 225c, and the base terminal 223b is coupled to the voltage source 204. In some examples, the base terminal 223b couples to the voltage source 204 via an additional voltage source, such as a voltage source 227. In some examples, the voltage source 227 can be implemented by a current mirror (not expressly shown), and the BJT 223 may form a portion of such a current mirror. The collector terminal 223c is coupled to the emitter terminal 216e and the emitter terminal 218e at a common emitter node 215. The differential amplifier 210 also includes the parasitic capacitor 221 that forms between the common emitter node 215 and the voltage source 204.

In some examples, the input stage 200 includes a level shifter 232 (which can also act as a buffer) that drives at least a portion of the differential amplifier 210. For example, the BJT 242 provides base signals to the BJTs 212, 214 and drives them. The level shifter 232 includes BJT 244 that includes an emitter terminal 244e, a base terminal 244b, and a collector terminal 244c. The BJT 242 includes BJT an emitter terminal 242e, a base terminal 242b, and a collector terminal 242c. The base terminal 244b is coupled to the common emitter node 215. The emitter terminal 244e is coupled to the emitter terminal 242e at the node 246, and the collector terminal 244c is coupled to the voltage source 204. The collector terminal 242c is coupled to the current source 250, which further couples to the voltage source 202. In some examples, the voltage source 202 can be a negative voltage source. In other examples, the voltage source 202 can be a positive voltage source. In other examples, the voltage source 202 can be a ground voltage source.

The base terminal 242b is coupled to the base terminals 212b, 214b. The input stage 200 further includes the cancellation capacitor 230 that is coupled between the node 246 and the node 248. The BJT 244, in some examples, acts as a buffer amplifier and generates, at the node 246, a signal corresponding to a common mode voltage received via the common emitter node 215. The BJT 244 is employed in the level shifter 232 and is reused as the buffer amplifier in the harmonic distortion cancellation circuit 231.

In the foregoing description of the differential amplifier 210 and the level shifter 232, the BJTs 212, 214, 216, 218, 223, 225, and 242 are npn type BJT, and the BJT 244 is pnp type BJT. However, it should be appreciated that examples of both the differential amplifier 210 and the level shifter 232 described above may employ some other type of BJT (e.g., pnp BJT or a combination of both npn BJT and pnp BJT). It should also be appreciated that the differential amplifier 210 depicted in FIG. 2 is merely one type of differential amplifier. In other examples, the differential amplifier 210 may assume a different structure, and the input stage 200 can be adapted to include a different structure of the differential amplifier 210.

In some examples, the capacitance of the parasitic capacitor 221 can be calculated using extraction tools and, based on that parasitic capacitance value, an appropriate cancellation capacitor 230 may be employed. For example, simulation software is used to determine the parasitic capacitance, and a cancellation capacitor 221 is selected with a capacitance that is substantially equal to the parasitic capacitance or that is proportional to the parasitic capacitance.

In operation, input signals 251 and 252 are fed to the BJTs 216 and 218 via the input terminals 217 and 219, respectively. The input signals 251, 252 drive the BJTs 216, 218, respectively, such that a common mode voltage signal appears on the common emitter node 215. Due to the presence of the parasitic capacitor 221, the common mode voltage produces an error current 253, which adds to or subtracts from the tail current present due to the cascoded tail current source formed by the BJTs 223, 225. The error current 253 includes even harmonic components, which are desired to be eliminated. The elimination of the error current 221 is performed by the even harmonic distortion cancellation circuit 231.

In the input stage 200, the BJT 244 acts as a buffer amplifier and receives the common mode voltage at the common emitter node 215. For simplicity's sake, assume that the capacitance of the cancellation capacitor 230 is substantially similar to the capacitance of the parasitic capacitor 221. In such a scenario, the BJT 244 receives at the base terminal 244b the common mode voltage and replicates a similar common mode voltage at the emitter terminal 244e, which generates a current 254 at the cancellation capacitor 230. The magnitude of the current 254 depends on the amplitude of the common mode voltage at the emitter terminal 244e and the capacitance value of the cancellation capacitor 230. This current 254 cancels the effect of the error current 253 via the node 248. Stated another way, the cancellation current 254 drives the BJT 223 to provide additional current to cancel the error current 253 in an event that the error current 253 subtracts from the tail current. Whereas, and the cancellation current 254 subtracts via the BJT 223 in an event that the error current 253 adds current to the tail current. In this example, the emitter terminal 223e functions as the current sense circuit 134 (FIG. 1), and drives the BJT 223, which acts as the controlled current source 138 (FIG. 1), to cancel the error current 253.

Figure 3:
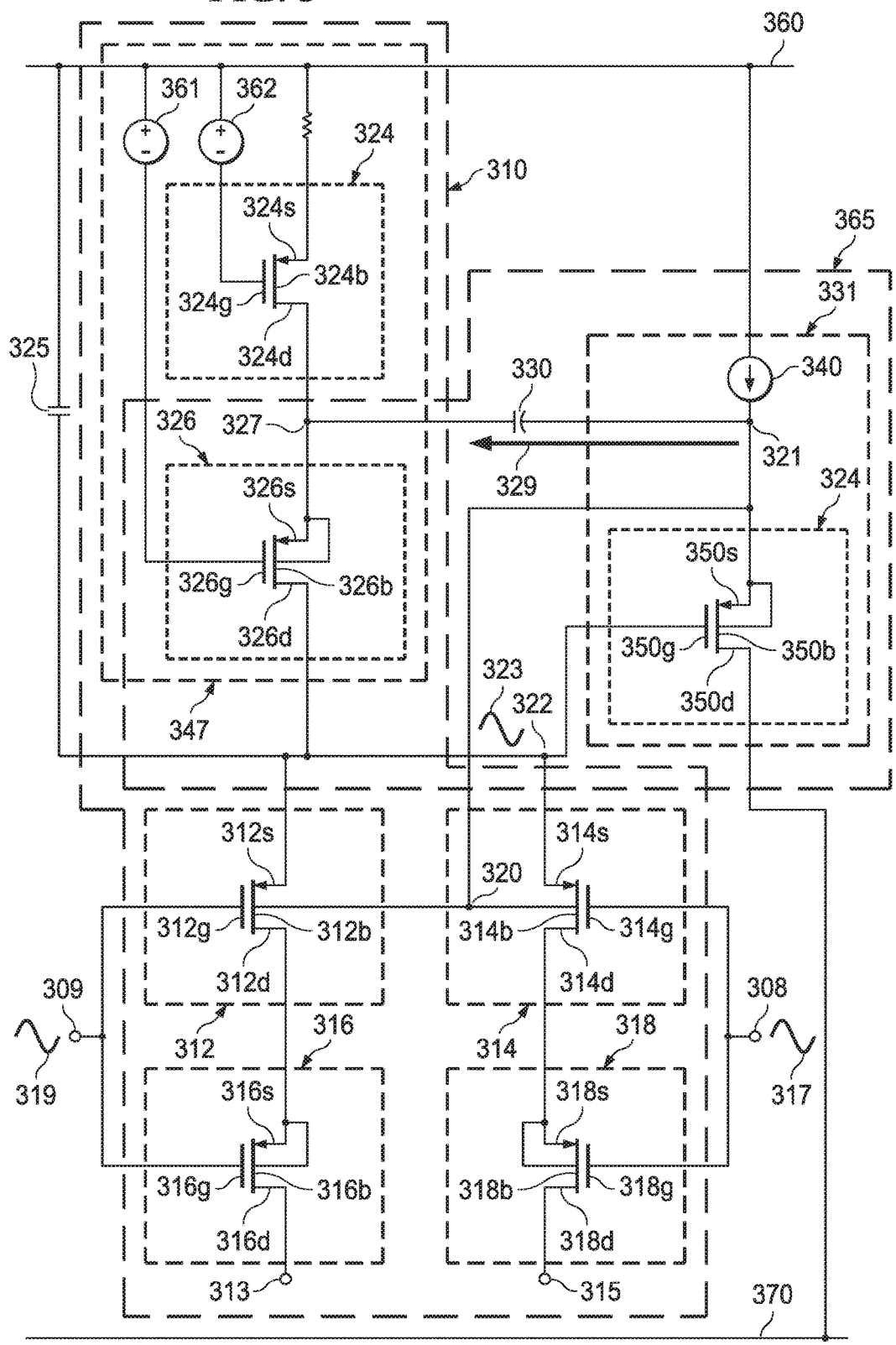
FIG. 3 depicts a schematic diagram of another illustrative input stage of an op-amp, in accordance with various examples in accordance with various examples.

Referring now to FIG. 3, a schematic diagram of yet another input stage 300 is shown. The input stage 300, similar to the input stage 100 and 200, includes a differential amplifier 310 that is coupled to an even harmonic distortion cancellation circuit 365, which includes a buffer amplifier 331 formed by the combination of a MOSFET 350 and a current source 340. The harmonic distortion cancellation circuit 365 further includes a cancellation capacitor 330 that is coupled within the input stage 300 such that it generates a cancellation current that substantially cancels out the even harmonic components generated due to the presence of a parasitic capacitor 325.

The input stage 300 includes an example differential amplifier 310 coupled to a MOSFET 350. In some examples, the differential amplifier 310 includes a main transistor pair formed by the MOSFETs 312, 314. The MOSFET 312 includes a source terminal 312s, a drain terminal 312d, a body terminal 312b, and a gate terminal 312g, where the MOSFET 312 is configured to receive a first input signal from the input terminal 309 via the gate terminal 312g. The MOSFET 314 includes a source terminal 314s, a drain terminal 314d, a body terminal 314b, and a gate terminal 314g, where the body terminal 312b and the body terminal 314b couple with each other at the node 320. The source terminal 314s couples to the source terminal 312s at a common source node 322. The MOSFET 314 is configured to receive a second input signal from the input terminal 308 via the gate terminal 314g. The body terminals 312b, 314b of the MOSFETs 312 and 314 are coupled at the node 320. The differential amplifier 310 also includes a cascoded transistor pair formed by the MOSFETs 316, 318. The MOSFET 312 cascodes with the MOSFET 316 and the MOSFET 314 cascodes with the MOSFET 318.

The MOSFET 316 includes a source terminal 316s, a drain terminal 316d, a gate terminal 316g, and a body terminal 316b, where the gate terminal 316g is also configured to receive the first input signal via the input terminal 309. In the differential amplifier 310, the drain terminal 312d couples to the source terminal 312s. The MOSFET 318 includes a source terminal 318s, a drain terminal 318d, a body terminal 318d, and a gate terminal 318g, where the gate terminal 318g is configured to receive the second input signal via the input terminal 308. In the differential amplifier 310, the drain terminal 314d is coupled to the source terminal 318s. The drain terminal 316d is configured to generate a first output at the output terminal 313 and the drain terminal 318d is configured to generate a second output at the output terminal 315. In some examples, the output terminals 313, 315 are configured to be coupled to external relevant circuitry (e.g., next stage of op-amp).

The differential amplifier 310 also includes a tail current source 347 (or a current source) that includes a MOSFET 324 having a source terminal 324s, a drain terminal 324d, a body terminal 324b, and a gate terminal 324g, where the source terminal 324s couples to a voltage source 360 via a DC voltage source 362. In some examples, the function of the voltage source 362 may be implemented by a current mirror (not expressly shown), and in such an example, the MOSFET 324 forms a portion of the current mirror. In some examples, the tail current source 347 may be cascoded tail source that includes MOSFETs 324, 326. The MOSFET 326 includes a source terminal 326s, a drain 326d, a body terminal 326b and a gate terminal 326g, wherein the source terminal 326s couples to the drain terminal 324d at the node 327, and the body terminal 326b couples to the source terminal 326s. The drain terminal 326d couples to the common source node 322.

The gate terminal 326g couples to the voltage source 360 via a DC voltage source 361. In some examples, the function of the voltage source 361 may be implemented by a current mirror (not expressly shown), and in such examples, the MOSFET 326 forms a portion of the current mirror. In some examples, the voltage source 360 is a positive voltage source. In some examples, the voltage source 360 is a negative voltage source. In other examples, the voltage source 360 is a ground source. As noted above, the even harmonic cancellation circuit includes the MOSFET 350. The MOSFET 350 includes a source terminal 350s, a drain terminal 350d, a body terminal 350b, and a gate terminal 350g. In the example input stage 300, the drain terminal 350d couples to the voltage source 370, the source terminal 350s couples to the current source 340. The gate terminal 350g couples to the common source node 322. In some examples, the voltage source 360 is a positive voltage source. The source 350s also couples to node 320. The source 350s and the current source 340, in some examples, drive the body terminals 312b, 314b. The node 321 couples to the node 320, and the node 321 couples to the node 327 via the cancellation capacitor 330.

In the foregoing description of the differential amplifier 310, the MOSFETs 312, 314, 316, 318, 324, and 326 are N-channel MOSFETs. However, it should be appreciated that examples of the differential amplifier 310 described above may employ P-channel MOSFETs or a combination of both P and N-channel MOSFETs. Therefore, it should also be appreciated that the differential amplifier 310 is merely one type of differential amplifier. In other examples, the differential amplifier 310 may assume a different structure, and the input stage 300 can be adapted to include different structures of the differential amplifier 310.

In some examples, the capacitance of the parasitic capacitor 325 can be calculated using extraction tools and, based on that parasitic capacitance value, an appropriate cancellation capacitor 330 may be employed. For example, simulation software is used to determine the parasitic capacitance, and a cancellation capacitor 330 is selected with a capacitance that is substantially equal to the parasitic capacitance or that is proportional to the parasitic capacitance.

In operation, input signals 317 and 319 are fed to the MOSFETs 312 and 314 via the input terminals 308 and 309, respectively. The input signals 317, 319 drive the MOSFETs 312, 314, respectively, such that a common mode voltage appears at the common source node 322. Due to the presence of the parasitic capacitor 325, the common mode voltage produces an error current 323, which flows to and from the common source node 322 to the parasitic capacitor 325. This error current 323 includes even harmonic components, which are desired to be eliminated. The elimination of the error current 323 is performed by the even harmonic distortion cancellation circuit 365.

As noted above, the MOSFET 350 acts as a buffer amplifier and receives the common mode voltage from the common source node 322. For simplicity's sake, assume that the capacitance of the cancellation capacitor 330 is substantially similar to the capacitance of the parasitic capacitor 325. In such a scenario, the MOSFET 350 receives at the gate terminal 350g the common mode voltage and replicates a similar voltage at the source terminal 350s, which generates a current 329 at the cancellation capacitor 330. The magnitude of the current 329 depends on the amplitude of the voltage at the source terminal 350s and the capacitance value of the cancellation capacitor 330. This current 329 cancels the effect of the error current 329 at the node 327. Stated another way, the cancellation current 329 provides additional current to the node 327 in the event that the error current subtracts the tail current, and the cancellation current 329 subtracts current at the node 327 in an event that the error current adds current to the tail current. Stated yet another way, the cancellation current 329 drives the MOSFET 326 to provide additional current to cancel the error current 323 in an event that the error current 323 subtracts from the tail current. Whereas, and the cancellation current 329 subtracts via the MOSFET 326 in an event that the error current 323 adds current to the tail current. In this example, the source terminal 326s functions as the current sense circuit 134 (FIG. 1), and drives the MOSFET 326, which acts as the controlled current source 138 (FIG. 1), to cancel the error current 323.

Figure 4:
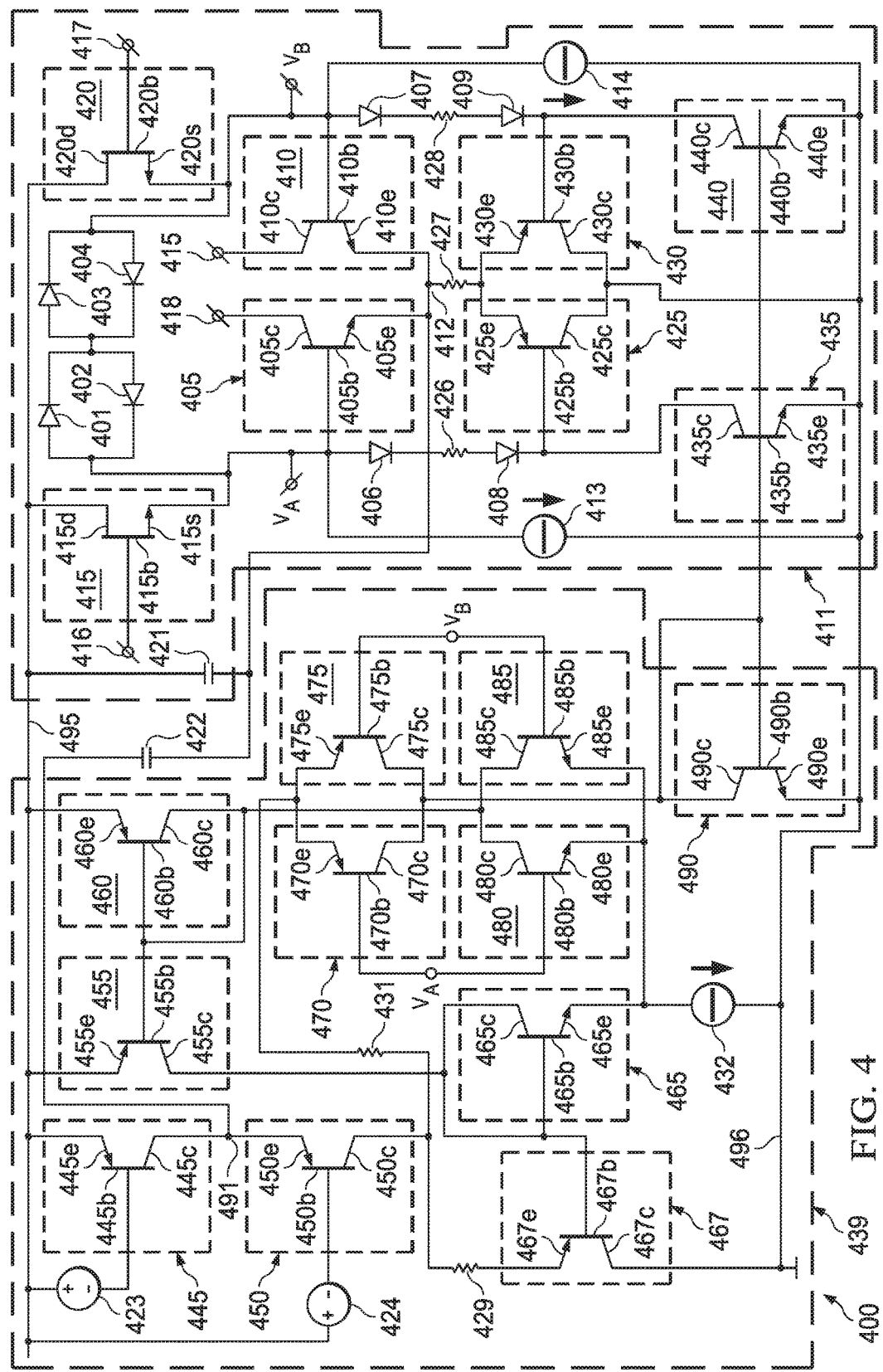
FIG. 4 depicts a schematic diagram of yet another illustrative input stage of an op-amp, in accordance with various examples.

Referring now to FIG. 4, a schematic diagram of yet another input stage 400 is shown. The input stage 400 depicts the implementation of even harmonic cancellation in a complex input stage. The input stage 400 includes a differential amplifier 411 that includes a differential pair that, as described below, couples to one or more translinear loops. The input stage 400 obeys exponential transfer characteristics, which, stated another way, means that the input signals provided to the input stage 400 result in an exponential output, with the output being an exponential function of the differential input signal. The transliner loop(s) forms a slew boost circuit, which, as described below, provides (or boosts) the tail current of the differential pair in the event that the differential input voltage is greater than a defined voltage, e.g., 0.7V. The input stage 400 also includes a transconductance linearization circuit 439 that is configured to linearize the transconductance response of the differential pair in the event the differential input voltage is lower than another defined voltage (e.g., 100 mV). The input stage 400 includes a cancellation capacitor 422 that is coupled between the common node of the differential pair and the transconductance linearization circuit.

The main differential pair of the differential amplifier 411 comprising BJTs 405 and 410. The BJT 405 has an emitter terminal 405e, a base terminal 405b, and a collector terminal 405c. The BJT 410 has an emitter terminal 410e, a base terminal 410b, and a collector terminal 410c. The emitter terminals 405e and 410e couple at a common emitter node 412, and the collector terminals 405c, 410c form the output terminals 418, 419, respectively. The common emitter node 412 couples to the parasitic capacitor 421 that may be formed between the common emitter node 412 and the voltage source 495. The bases of the differential pair 405, 410, in some examples, are coupled to a MOSFET, such that the source terminals of the MOSFET drive the differential pair 405, 410. For example, the differential amplifier 411 includes driver MOSFETs 415, 420 that are coupled to the BJTs 405, 410, respectively. The MOSFET 415 comprises a source terminal 415s, a gate terminal 415g, and a drain terminal 415d. The MOSFET 420 comprises a source terminal 420s, a gate terminal 420g, and a drain terminal 420d. The source terminal 415s couples to the base terminal 405b, and the source terminal 420s couples to the base terminal 410b. The drain terminals 415d, 420d couple to a voltage source 495. The gates 415g, 420g are configured to receive the inputs of the input stage 400 via the terminals 416, 417, respectively.

As noted above, the differential amplifier 411 includes a slew rate booster circuit, which is formed partially by the differential pair 405, 410. The slew rate booster circuit also includes a diode 407, a resistor 426, a diode 409, a BJT 430, a resistor 427, a BJT 425, a diode 408, a resistor 426, and a diode 406. The BJT 425 has an emitter terminal 425e, a base terminal 425b, and a collector terminal 425c. The BJT 430 has an emitter terminal 430e, a base terminal 430b, and a collector terminal 430c. The diode 407 couples to the emitter terminal 410e and the source terminal 420s. The resistor 428 couples to the diode 407 and the diode 409. The diode 409 couples to the base terminal 430b. The resistor 427 couples to the emitter terminal 405e and the emitter terminals 425e, 430e. The diode 408 couples to the resistor 426 and the base 425b. The resistor 426 couples to the diode 406 and the diode 406 couples to the base 405b. In some examples, the differential amplifier 411 also includes a translinear loop formed, in part, by the differential pair 405, 410. In some examples, the translinear loop includes BJTs 405, 410, 425, 430; diodes 406, 407, 408, 409; resistors 426, 427, 428.

The differential amplifier 411, in some examples, includes current sources 413, 414 that are coupled to the bases 405b, 410b, respectively. The current sources 413, 414 also may couple to a voltage source 496. The differential amplifier 411 also may include current sources formed by BJTs 435, 440. The BJT 435 has an emitter terminal 435e, a base terminal 435b, and a collector terminal 435c. The BJT 440 has an emitter terminal 440e, a base terminal 440b, and a collector terminal 440c. The collector terminals 435c, 440c couple to the bases 425b, 430b, respectively. The emitter terminals 435e, 440e couple to the voltage source 496. In some examples, the differential amplifier 411 also includes a pair of diodes 401, 402 coupled to each other and to the source terminal 415s and the base terminal 405b. In some examples, the differential amplifier 411 includes another pair of diodes 403, 404 coupled to each other and to the source terminal 420s and the base terminal 410b. In some examples, the pair of diodes 401, 402 also couples to the other pair of diodes 403, 404.

As noted above, the input stage 400 also includes a transconductance linearization circuit 439 that includes BJTs 445, 450, 455, 460, 465, 467, 470, 475, 480, 485, and 490. The transconductance linearization circuit 439 also includes resistors 429, 431 and a current source 432. The BJT 445 has an emitter terminal 445e, a base terminal 445b, and a collector terminal 445c. The BJT 450 has an emitter terminal 450e, a base terminal 450b, and a collector terminal 450c. The BJT 455 has an emitter terminal 455e, a base terminal 455b, and a collector terminal 455c. The BJT 460 has an emitter terminal 460e, a base terminal 460b, and a collector terminal 460c. In some examples, the collector terminal 460c couples to the base terminal 460b. The BJT 465 has an emitter terminal 465e, a base terminal 465b, and a collector terminal 465c. The BJT 467 has an emitter terminal 467e, a base terminal 467b, and a collector terminal 467c. The BJT 470 has an emitter terminal 470e, a base terminal 470b, and a collector terminal 470c. The BJT 475 has an emitter terminal 475e, a base terminal 475b, and a collector terminal 475c. The BJT 480 has an emitter terminal 480e, a base terminal 480b, and a collector terminal 480c. The BJT 485 has an emitter terminal 485e, a base terminal 485b, and a collector terminal 485c. The BJT 490 has an emitter terminal 490e, a base terminal 490b, and a collector terminal 490c. In some examples, the collector terminal 490c couples to the base terminal 490b.

The BJTs 445, 450 form the current source. The emitter terminal 445e couples to the voltage source 495, the base 445b and, in some examples, couples to a DC voltage source 423, which further couples to the voltage source 495. The emitter terminal 450e couples to the collector terminal 445c at the node 491, and the base terminal 450b couples to a DC voltage source 424, which further couples to the voltage source 495. A cancellation capacitor 422 couples to the node 491 and the common emitter node 412. In some examples, the function of the voltage source 423 is implemented by a current mirror (not expressly shown), and in such examples, the BJT 445 forms a portion of the current mirror. In some examples, the function of the voltage source 424 may be implemented by a current mirror (not expressly shown), and in such an example, the BJT 424 forms a portion of the current mirror.

The emitter terminals 455e, 460e couple to the voltage source 495, and the base terminals 455b, 460b couple to each other. The collector terminal 460c couples to the base terminal 460b. The collector terminal 455c couples to the collector terminal 465c, which further couples to the base terminal 465b. The emitter terminal 465e couples to the current source 432, which further couples to the voltage source 496. The base terminal 465b couples to the base terminal 467b. The emitter terminal 467e couples to the resistor 429, which further couples to the collector terminal 450c. The collector terminal 467c couples to the voltage source 496.

The emitter terminals 470e, 475e couple to the resistor 431, which further couples to the collector terminal 450c. The collector terminals 470c, 475c couple to the collector terminals 490c. The emitter terminal 490e couples to the voltage source 496. The base terminal 490b couples to the base terminals 435b and 440b. The collector terminals 480c, 485c couple to each other and the collector terminal 460c. The emitter terminals 480e, 485e couple to each other and the emitter terminal 465e. The base terminals 480b and 470b couple to each other and are configured to receive a voltage potential at the source terminal 415s (denoted by "Va"). The base terminals 475b, 485b couple to each other and are configured to receive a voltage potential at the source terminal 420s (denoted by "Vb").

The transconductance linearization circuit 439, in some examples, includes at least one translinear loop. Such a translinear loop is formed by the BJTs 470, 480, 465, 467, resistor 429, and resistor 431. In some examples, the transconductance linearization circuit includes another translinear loop. This trans-linear loop is formed by the BJTs 485, 475, 465, 467, and the resistors 429 and 431.

In some examples, the capacitance of the parasitic capacitor 421 can be calculated using extraction tools and, based on that parasitic capacitance value, an appropriate cancellation capacitor 422 may be employed. For example, simulation software is used to determine the parasitic capacitance, and a cancellation capacitor 422 is selected with a capacitance that is substantially equal to the parasitic capacitance or that is proportional to the parasitic capacitance.

In operation, the input signal is fed to the gate terminals 415g, 420g. The input signal produces a potential drop at the base terminals 405b, 410b that generates a common mode voltage at the common emitter node 412. This common mode voltage generates an error current at the common emitter node 412. The common mode voltage, via the cancellation capacitor 422, generates a cancellation current that is fed to the node 491. As noted above, the current sources formed by the BJTs 445, 450 receive the cancellation current and add or subtract from the bias current of the transconductance linearization circuit. The compensation current is then fed from the BJT 490 to the BJTs 435, 440, which further substantially eliminates the error current generated due to the presence of the parasitic capacitor 421. In addition to elimination of the error current due to the parasitic capacitor, the transconductance linearization circuit generates a current proportional to the difference of voltage applied to the gates of 415 and 420 that is fed to 435 and 440 through 490. This current linearizes the output current generated by input pair 405-410 and in-turn substantially removes odd harmonic distortion.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
a differential amplifier coupled to a parasitic capacitor positioned between a first node and a first reference voltage source;
a buffer amplifier having an input terminal and an output terminal, the input terminal coupled to the first node and the output terminal coupled to a cancellation capacitor;
a controlled current source coupled to the first node and the input terminal, the controlled current source coupled to a second reference voltage source; and
a current sense circuit coupled to the cancellation capacitor and the second reference voltage source.

2. The system of claim 1, wherein the first reference voltage source is substantially equal to the second reference voltage source.

3. The system of claim 1, wherein the buffer amplifier is a voltage buffer amplifier that is configured to receive a voltage signal from the first node.

4. The system of claim 1, wherein the differential amplifier includes:
a first bipolar junction transistor (BJT) having a first emitter, a first base, and a first collector;
a second BJT having a second emitter, a second base, and a second collector; and
a current source coupled to the first and the second emitters.

5. The system of claim 1, wherein the reference voltage source is selected from the group consisting of a ground voltage source, a positive voltage source, and a negative voltage source.

6. The system of claim 1, wherein a cancellation capacitance of the cancellation capacitor is proportional to a parasitic capacitance of the parasitic capacitor.

7. The system of claim 1, wherein the parasitic capacitor is configured to generate an error current, wherein the controlled current source is configured to generate a cancellation current substantially equal to the error current.

8. A system, comprising:
a differential amplifier, comprising:
a first bipolar junction transistor (BJT) having a first emitter terminal, a first collector terminal, and a first base terminal;
a second BJT having a second emitter terminal, a second collector terminal, and a second base terminal, wherein the first and the second emitter terminals couple at a common emitter node;
a parasitic capacitor coupled between the common emitter node and a first voltage source;
a third BJT having a third emitter terminal, a third collector terminal, and a third base terminal, the third emitter terminal coupled to the first collector terminal;
a fourth BJT having a fourth emitter terminal, a fourth collector terminal, and a fourth base terminal, the fourth emitter terminal coupled to the second collector terminal, and the third base terminal coupled to the fourth base terminal; and
a tail current source coupled to the common emitter node and to the first voltage source;
a level shifter circuit coupled to the differential amplifier; and
a cancellation capacitor coupled between the level shifter and the tail current source.

9. The system of claim 8, wherein the tail current source comprises:
a fifth BJT having a fifth emitter terminal, a fifth collector terminal, and a fifth base terminal, the fifth emitter terminal and fifth base terminal coupled to the first voltage source;
a sixth BJT having a sixth emitter terminal, a sixth collector terminal, and a sixth base terminal, the sixth emitter terminal coupled to the fifth collector terminal at a first node, and the sixth base terminal coupled to the first voltage source, the sixth collector terminal coupled to the common emitter node.

10. The system of claim 8, wherein the level shifter comprises:
a seventh BJT having a seventh emitter terminal, a seventh collector terminal, and a seventh base terminal, the seventh collector terminal coupled to the first voltage source;
an eighth BJT having an eighth emitter terminal, an eighth collector terminal, and an eighth base terminal, the eighth collector terminal coupled to a current source that is further coupled to a second voltage source, the eighth emitter terminal coupled to the seventh emitter terminal at a second node, the eighth collector terminal couples to the eighth base terminal and to the third base terminal.

11. The system of claim 10, wherein the cancellation capacitor is coupled between the first node and the second node.

12. The system of claim 8, wherein a parasitic capacitance of the parasitic capacitor is proportional to a cancellation capacitance of the cancellation capacitor.

13. A system, comprising:
a differential amplifier, comprising:
a first metal-oxide-semiconductor-field-effect-transistor (MOSFET) having a first source terminal, a first drain terminal, a first gate terminal, and a first body terminal;
a second MOSFET having a second source terminal, a second drain terminal, a second gate terminal, and a second body terminal, wherein the first body terminal is coupled to the second body terminal at a first node, wherein the first source terminal and the second source terminal couple at a common source node;
a third MOSFET having a third source terminal, a third drain terminal, and a third gate terminal, wherein the first drain terminal couples to the third source terminal;
a fourth MOSFET having a fourth source terminal, a fourth drain terminal, and a fourth gate terminal, wherein the second drain terminal is coupled to the fourth source terminal; and
a tail current source coupled between the common source node and a first voltage source;
a buffer amplifier coupled to the common source node, the first voltage source, and a second voltage source; and
a cancellation capacitor coupled between the buffer amplifier and the tail current source.

14. The system of claim 13, wherein the tail current source comprises:
- a fifth MOSFET having a fifth source terminal, a fifth drain terminal, and a fifth gate terminal, wherein the fifth source couples to the first voltage source;
- a sixth MOSFET having a sixth source terminal, a sixth drain terminal, and a sixth gate terminal, wherein the sixth source couples to the fifth drain terminal at a second node, wherein the sixth drain terminal couples to the common source node.

15. The system of claim 13, wherein the buffer amplifier comprises:
- a seventh MOSFET having a seventh source terminal, a seventh drain terminal, and a seventh gate terminal, the seventh drain terminal coupled to the second voltage source, the seventh source terminal coupled to the first voltage source via a current source.

16. The system of claim 13, wherein a parasitic capacitance of the parasitic capacitor is proportional to a cancellation capacitance of the cancellation capacitor.

* * * * *